US009511992B2

(12) United States Patent
Baillin

(10) Patent No.: US 9,511,992 B2
(45) Date of Patent: Dec. 6, 2016

(54) ENCAPSULATION STRUCTURE PROVIDED WITH A CAP AND A SUBSTRATE TO CONNECT AT LEAST ONE NANO-OBJECT ONTO A FACE OF THE SUBSTRATE AND TO RESUME CONTACT THROUGH THE CAP AND METHOD OF MANUFACTURING THE STRUCTURE

(71) Applicant: Commissariat a L'Energie Atomique et aux Energies Alternatives, Paris (FR)

(72) Inventor: Xavier Baillin, Crolles (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/857,047

(22) Filed: Sep. 17, 2015

(65) Prior Publication Data

US 2016/0090296 A1 Mar. 31, 2016

(30) Foreign Application Priority Data

Sep. 30, 2014 (FR) ...................................... 14 59243

(51) Int. Cl.
*H01L 23/48* (2006.01)
*B81B 7/00* (2006.01)
*B81C 1/00* (2006.01)

(52) U.S. Cl.
CPC ........... *B81B 7/007* (2013.01); *B81C 1/00269* (2013.01); *B81B 2207/095* (2013.01); *H01L 23/481* (2013.01); *H01L 2924/161* (2013.01)

(58) Field of Classification Search
CPC .......................... H01L 23/481; H01L 2924/161
USPC ........................................................ 257/774
See application file for complete search history.

(56) References Cited

U.S. PATENT DOCUMENTS

| 8,692,385 B2 | 4/2014 | Thuaire et al. |
| 2010/0003789 A1 | 1/2010 | Caplet et al. |
| 2012/0052313 A1 | 3/2012 | Sibuet et al. |
| 2012/0328779 A1 | 12/2012 | Caplet et al. |

(Continued)

FOREIGN PATENT DOCUMENTS

| FR | 2 992 773 A1 | 1/2014 |
| WO | WO 2009/022982 A1 | 2/2009 |
| WO | WO 2014/001920 A1 | 1/2014 |

OTHER PUBLICATIONS

U.S. Appl. No. 14/725,028, filed May 29, 2015, Xavier Baillin.

(Continued)

*Primary Examiner* — Douglas Menz
(74) *Attorney, Agent, or Firm* — Oblon, McClelland, Maier & Neustadt, L.L.P.

(57) ABSTRACT

This structure, that is applicable particularly to manufacturing of <<Beyond CMOS>> type systems comprises a substrate (74) with opposite first and second faces, a cap (80) with opposite first and second faces, the first face of the cap being fixed to the first face of the substrate, at least one cavity (86) defined between the cap and the substrate, at least one nano-object (72) in the cavity, and first doped zones (88, 90) that are formed in the substrate, on the first face of the substrate, the nano-object being electrically connected to the first doped zones. According to the invention, the structure also comprises second doped zones (92, 96) that are formed in the cap, on the first face of the cap and that are at least partially in direct contact with the first doped zones, and means of making contact (96, 98) between the first and the second face of the cap and that open up on the second doped zones.

14 Claims, 8 Drawing Sheets

(56) References Cited

U.S. PATENT DOCUMENTS

| | | |
|---|---|---|
| 2013/0207281 A1 | 8/2013 | Baillin et al. |
| 2014/0038364 A1 | 2/2014 | Nicolas et al. |
| 2015/0028433 A1 | 1/2015 | Baillin et al. |
| 2015/0151959 A1 | 6/2015 | Baillin |
| 2015/0243594 A1 | 8/2015 | Baillin et al. |

OTHER PUBLICATIONS

French Preliminary Search Report issued May 22, 2015 in French Application 14 59243, filed Sep. 30, 2014 (with English Translation of Categories of Cited Documents).

Olof Engström et al. "Electrical Characterization of Bonding Interfaces", J. Electrochem. Soc., vol. 139, No. 12, Dec. 1992, 7 pages.

S. Essig et al. "Fast Atom Beam Activated Wafer Bonds Between n-Si and n-GaAs with Low Resistance", ECS Journal of Solid State Science and Technology, vol. 2, No. 9, 2013, 4 pages.

ENCAPSULATION STRUCTURE PROVIDED WITH A CAP AND A SUBSTRATE TO CONNECT AT LEAST ONE NANO-OBJECT ONTO A FACE OF THE SUBSTRATE AND TO RESUME CONTACT THROUGH THE CAP AND METHOD OF MANUFACTURING THE STRUCTURE

TECHNICAL FIELD

This invention relates to an encapsulation structure provided with a cap and a substrate to electrically connect at least one nano-object onto a face of the substrate and to resume the electrical contact through the cap. It also relates to a method of manufacturing the structure.

It can be used to collectively make structures comprising at least one nano-object hermetically encapsulated under a controlled atmosphere; and it is applicable particularly to manufacturing of <<Beyond CMOS>> type microelectronic systems using specific properties of nano-objects.

Nano-objects (including molecules, carbon nanotubes, DNA strands, proteins and more generally any submicronic sized object) have to be placed, grafted or hybridised on a support provided with electrical connectors with a surface condition that has to be compatible with reception of nano-object(s) and advantageously for which the roughness must be controlled and advantageously of the order of the atomic scale, in order to determine at least their function (electrical, optical, sensitive, etc.). Considering their size, the distance between electrical connectors must be as close as possible to the size of the nano-object to which they are to be connected.

Furthermore, in order to characterise or to make nano-objects function in ambient air, they need to be protected from the outside by a cap hermetically sealed to the substrate. The encapsulation structure thus obtained can be used to make the equivalent of an electronic component that can then be manipulated and tested. It is found that the use of a wafer type substrate and cap is still a preferred solution considering collective technologies developed in the microelectronic industry, particularly the WLP (Wafer Level Packaging) technique.

STATE OF PRIOR ART

At the moment there is no simple technological solution to collectively hybridise nano-objects on a silicon wafer with a perfectly controlled surface roughness. There are approaches like those disclosed in the following document:
[1] WO 2009/022982, Nano-interconnects for atomic and molecular scale circuits.

This document discloses the manufacture of through electrical connectors also called Through Silicon Vias (TSV) that requires the use of a special tool, namely a FIB (Focused Ion Beam) for local machining of these vias for which the diameter and also the depth will be limited by the method used for their fabrication. This technology cannot use a collective photolithography and etching process. Furthermore, the fact of having to incline the through vias in order to reduce their spacing increases the complexity in machining because the angle of inclination of the ion beam relative to the plane of the substrate has to be controlled precisely.

This known technique is shown in FIG. 1 that is a diagrammatic sectional view of a substrate equipped with nanometric sized interconnects. Nanovias 2, 4 are machined from the lower face of a substrate 6. They open up onto the inner face at the bottom of a cavity 8, where a nano-object 10 to be connected will be placed. The initial substrate is of the SOI type; it is composed of a thick silicon layer 12 followed by a buried oxide layer 14 (BOX) and finally a thin silicon layer 16 in which the vias are formed.

A second approach is disclosed in the following document:
[2] U.S. Pat. No. 8,692,385, corresponding to FR 2 969 592 and EP 2 469 589.

This approach relates to a device to connect nano-objects to external electrical systems and is particularly applicable to characterisation of molecules. According to this second approach, a device is manufactured comprising an upper layer provided with upper contact pads to be connected to a nano-object; a lower layer provided with lower contact pads to be connected to an external electrical system; a connection layer comprising through electrical vias in contact with the lower pads; and at least two layers provided with conducting lines and electrical vias between the connecting layer and the upper layer, to connect the upper pads to the lower pads.

Manufacturing of such a structure requires a large number of technological operations and in particular it requires an operation to clear the front face of the substrate used by a thinning and polishing operation. This step is critical because the surface condition obtained after thinning directly influences the surface reconstruction step of the surface on which the nano-object will be placed and particularly its roughness. In addition to this step, an identical operation is necessary to expose the used TSVs.

This second known technique is shown in FIG. 2 that is a diagrammatic sectional view of a device comprising an upper layer 18 provided with upper contact pads 20 to be connected to a nano-object 22; a lower layer 24 provided with lower contact pads 26 to be connected to an external electrical system 28; and a connecting layer 30 comprising through electrical vias 32 in contact with the lower pads; and at least two layers 34, 36 between the connecting layer and the upper layer provided with conducting lines 38 and electrical vias 40 to connect the upper pads to the lower pads. The front face of the substrate used is referenced as mark 41.

A third approach is disclosed in the following document:
[3] WO 2014/001920, corresponding to FR 2992 773.

FIG. 3 is a diagrammatic sectional view of a particular embodiment of the reception structure according to this document [3], and FIG. 4 is a top view of this particular embodiment.

This reception structure or interposer is marked as reference 42 in FIGS. 3 and 4. It is provided with horizontal electrical connections connected to vertical electrical connections. More precisely, the reception structure 42 shown in FIGS. 3 and 4 comprises a support 44 for which the reference mark of the upper face or the front face is 46 and the reference mark of the lower face opposite the upper face is 48. This reception structure 42 is designed to electrically connect a nano-object 50 onto the upper face 46 and to resume the electrical contact on the lower face 48.

The reception structure 42 also comprises two TSV type interconnects 52 and 54 that pass through the support 44 from the upper face 46 to the lower face 48. These faces 46 and 48 include contact zones for each of the interconnects 52 and 54 respectively: the contact zones associated with interconnects 52 and 54 on the upper face 46 (lower face 48 respectively), are marked as references 56 and 58 (60 and 62 respectively).

In the example shown, the support 44 is a semiconductor on insulator type multi-layer. It comprises a resistive silicon layer 64 formed by a silica layer 66 itself formed on a silicon substrate 68.

The contact zones 56 and 58 are doped zones of the support 44. And each doped zone 56 or 58 has a pattern adapted to spreading of the interconnect 52 or 54 associated with it on the upper face 46 of the support 44. Manufacturing of such a reception structure in which TSVs are in the reception support of the nano-object requires a passage through a thinned substrate. This is because it is impossible at the moment to make TSVs with a reasonable size or cost that would pass through an unthinned support. Therefore, the support and a cap have to be assembled before the support is thinned, and the cap acts as a handle.

Therefore the two most recent technologies known by documents [2] and [3] require that the reception support should be handled several times and thinning steps are necessary.

PRESENTATION OF THE INVENTION

The purpose of this invention is to overcome the disadvantages mentioned above.

In particular, it discloses an encapsulation structure comprising a reception substrate on which at least one nano-object is electrically connected to interconnects formed in the plane of the substrate (these can thus be referred to as horizontal interconnects) and are connected to vias passing through a cap and opening up on said interconnects, the cap being made integral with the substrate through a bond interface; each horizontal interconnect is made by assembly of a doped zone of the substrate with a doped zone of the cap; and a via passes through the cap and opens up on said interconnect.

Advantageously, the substrate and the cap include a multi-layer comprising at least one resistive layer on its upper face, the doped zone being made in a part of the thickness of said layer. Preferably, this resistive layer is a semiconducting layer of an SOI type support.

Each of the doped zones has a pattern adapted to spreading of the corresponding interconnect in the plane of the bond interface and has a geometry that allows misalignment between the substrate and the cap when fixing the substrate and the cap together.

Precisely, the purpose of this invention is a structure for encapsulation of at least one nano-object comprising:
  a substrate with opposite first and second faces,
  a cap with opposite first and second faces, the first face of the cap being fixed to the first face of the substrate,
  at least one cavity defined between the cap and the substrate,
  at least one nano-object in the cavity, and
  first doped zones that are in the substrate on the first face of the substrate, the nano-object being electrically connected to at least two of said first doped zones, characterised in that it also comprises:
  second doped zones that are in the cap on the first face of the cap and that are electrically connected to the first doped zones, and
  means of making contact that range from the second face to the first face of the cap and that open up on the second doped zones, these means being electrically connected to these said second zones.
Preferably, the second doped zones are at least partially in direct contact with the first doped zones.

According to a first particular embodiment of the encapsulation structure according to the invention, the substrate is a first multi-layer and comprises at least a first resistive layer on the first face of the substrate, and in which the first doped zones are formed in the first resistive layer, on at least part of the thickness of the first resistive layer.

Preferably, the substrate is of the semiconductor on insulator type and it thus comprises a first semiconducting surface layer, in which the first resistive layer is formed by the first semiconducting surface layer.

According to a second particular embodiment, the cap is a second multi-layer and it comprises at least one second resistive layer on the first face of the cap, and in which the second doped zones are formed in the second resistive layer, on at least part of the thickness of the second resistive layer.

Preferably, the cap is of the semiconductor on insulator type and it thus comprises a second semiconducting surface layer, in which the second resistive layer is formed by the second semiconducting surface layer.

According to a first particular embodiment of the invention, the means of making contact include vias passing through the cap.

According to a second particular embodiment, the contact means include:
  holes that taper outwards from the second doped zones to the second face of the cap, and
  electrically conducting wires respectively arranged in said holes and that are electrically connected to the corresponding second doped zones respectively.
As a variant, the contact means may include:
  holes that taper outwards from the second doped zones to the second face of the cap, and
  electrically conducting test points, respectively arranged in said holes and adapted to be electrically connected to the corresponding second doped zones respectively.

Preferably, the first face of the cap is fixed to the first face of the substrate by bonding.

Bonding is preferably direct.

This present invention also relates to a method of fabricating the encapsulation structure according to the invention, in which:
  the first doped zones are formed in the substrate,
  the cavity is formed in the cap,
  the means of making contact are formed in the cap,
  the second doped zones are formed in the cap,
  said at least one nano-object is connected to said at least two first doped zones, and
  the cap is assembled and bonded to the substrate.

The order of steps in the fabrication method may be modified. In particular, the substrate may be prepared before the cap or vice versa. Steps may also be carried out simultaneously, for example steps for the formation of the doped zones and/or the smoothing steps (surface preparation).

According to an additional characteristic of the method according to the invention, a smoothing step of said first face of the substrate and/or said first face of the cap is/are carried out after the step to make the first doped zones and/or the second doped zones respectively.

According to another additional characteristic of the method according to the invention, bonding is a direct bonding.

BRIEF DESCRIPTION OF THE DRAWINGS

This invention will be better understood after reading the description of example embodiments given below, purely for guidance and in no way limitative with reference to the appended drawings in which.

DETAILED PRESENTATION OF PARTICULAR EMBODIMENTS

Various examples of this invention are given below in which the encapsulation structure is composed of a substrate and a cap, both made of a semiconducting material and advantageously from silicon in these examples, in order to protect one or more nano-objects and to electrically connect them from the front face of the substrate to the back face of the cap using solely microelectronic technologies to spread electrical contacts from the front face of the substrate to the back face of the cap, while limiting operations on the substrate to the strict minimum.

The surface condition of the front face of the substrate is generally compatible with the reception of one or more nano-objects that are advantageously used for direct assembly between the substrate and the cap by direct bonding, when the surface condition of the cap is also compatible with this direct assembly.

The electrical lines on the front face of the substrate and the front face of the cap are made on a semiconducting substrate, advantageously of the SOI (Silicon On Insulator) type, by means of doped zones and vias that pass through the cap and open up on said doped zones, so as to resume contacts and to bring them to the back face of the cap. The geometries of the lines and vias are adapted to enable misalignment between them when the cap is fixed to the substrate.

Figure 1:
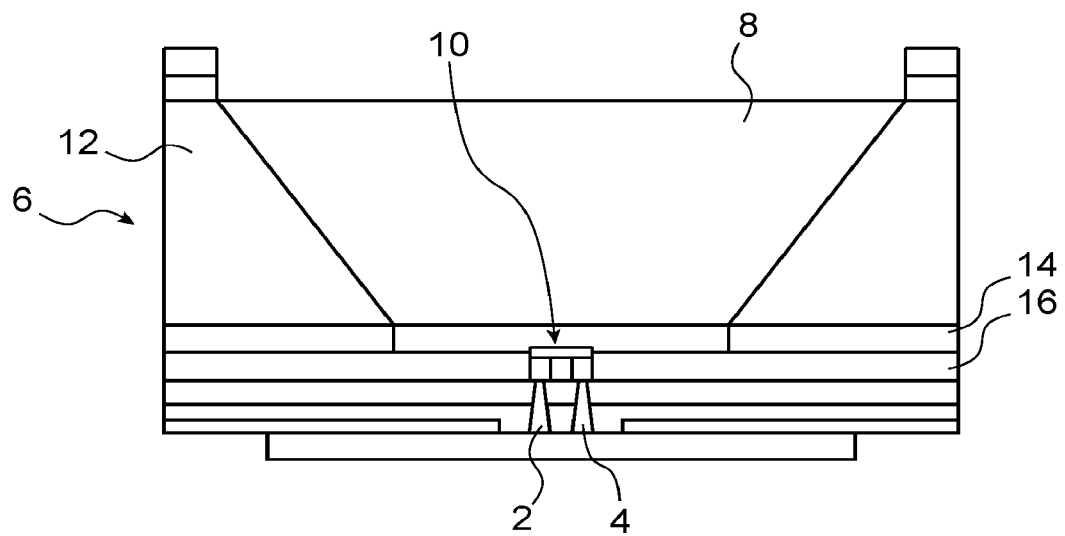
FIG. 1 is a diagrammatic sectional view of a support fitted with interconnects disclosed in document [1] and has already been described.
Figure 2:
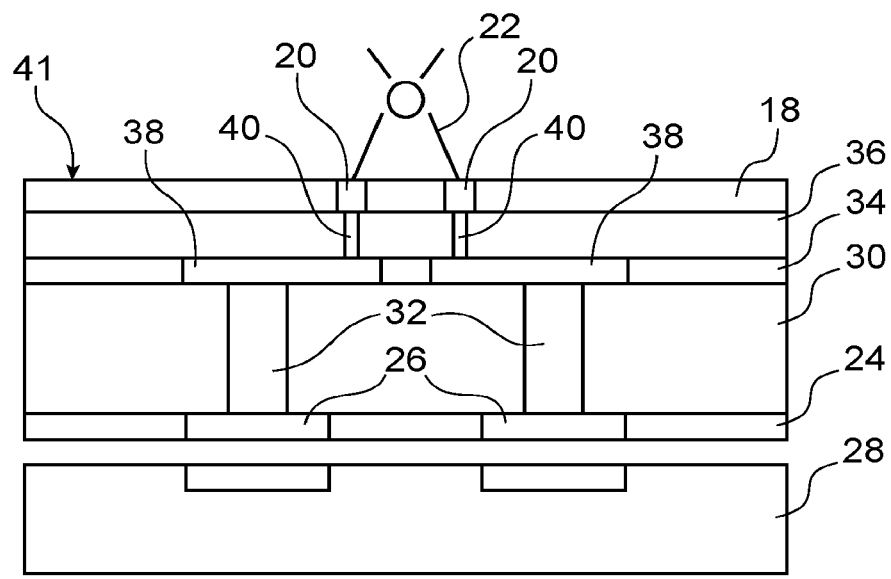
FIG. 2 is a diagrammatic sectional view of an example of the device disclosed in document [1] and has already been described.
Figure 3:
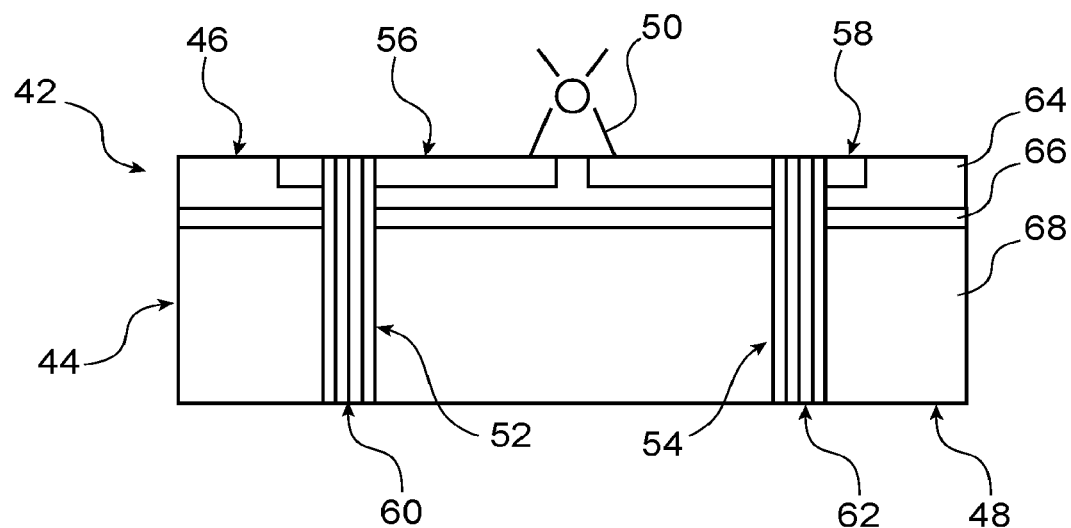
FIG. 3 is a diagrammatic cross-sectional view of an example of the reception structure disclosed in document [3] and has already been described.
Figure 4:
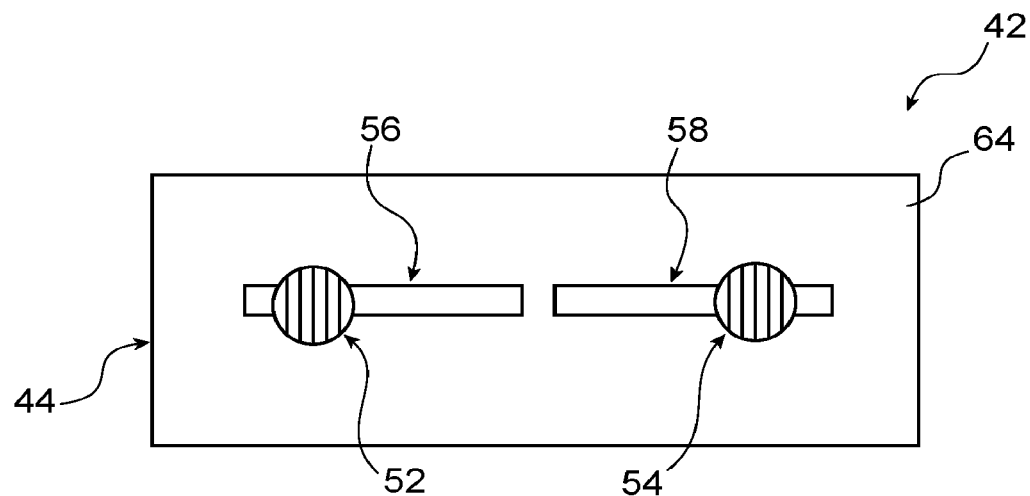
FIG. 4 is a diagrammatic top view of this example.
Figure 5A:
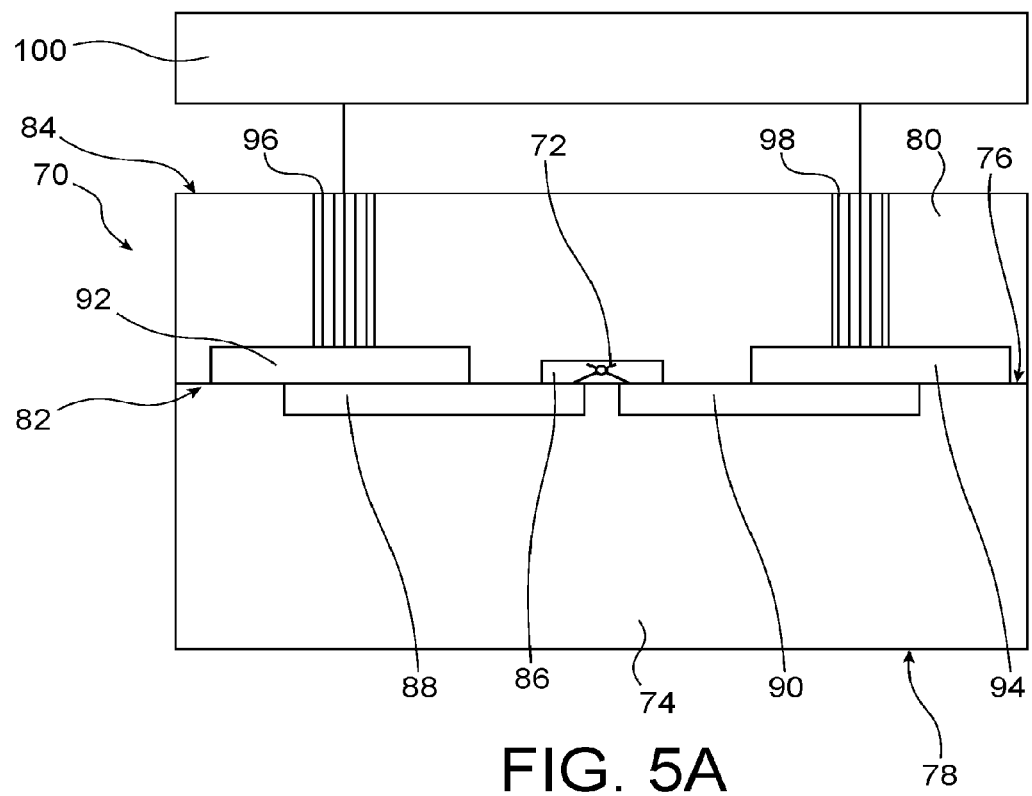
FIG. 5A is a diagrammatic cross-sectional view of an example of an encapsulation structure according to the invention.
Figure 5B:
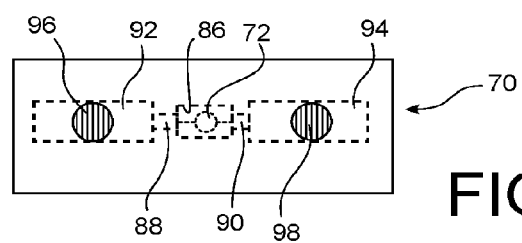
FIG. 5B is a diagrammatic top view of the example in FIG. 5A.

FIG. 5A is a cross-sectional diagrammatic view of a first particular embodiment of the encapsulation structure according to the invention. FIG. 5B is a diagrammatic top view of this first particular embodiment.

The structure 70, shown in FIGS. 5A and 5B will encapsulate a nano-object 72 and it comprises a substrate 74 with a first or front face 76 and a second or back face 78 opposite the front face 78. The structure 70 also comprises a cap 80 with a first or front face 82 and a second or back face 84 opposite the front face 82.

The front face 82 of the cap 80 is fixed to the front face 76 of the substrate 74. In the example described, these faces 76 and 82 are bonded to each other.

The structure 70 also comprises a cavity 86 defined between the cap 80 and the substrate 74. In the example described, it is formed in the cap 80 as can be seen. The nano-object 72 is in this cavity 86.

Doped zones 88 and 90 are formed in the substrate 74 in the front face 76 of the substrate. The nano-object is electrically connected to the zones 88 and 90 as can be seen in FIG. 5A.

The structure 70 also comprises other doped zones 92 and 94 formed in the cap 80 in the front face 82 of the cap. These zones 92 and 94 are at least partially in direct contact with zones 88 and 90 respectively.

The structure 70 also comprises means of making contact 96, 98 between the front face and the back face of the cap 80 and which open up onto doped zones 92 and 94 respectively. As can be seen in FIG. 5A, these means of making contact can be used for example to connect the nano-object 72 to an appropriate external electrical system 100 in order to make electrical measurements on the nano-object 72.

In the example show in FIGS. 5A and 5B, these means of making contact 96 and 98 are through vias.

Note also that in the example shown in FIGS. 5A and 5B, the substrate 74 and the cap 80 are made from a semiconducting material and are fixed by direct semiconductor/semiconductor bonding on their front faces. "Direct bonding" means bonding without the addition of glue which is done simply by interatomic bonds between faces in contact. Zones 88, 90, 92, 94 are doped by implantation and activation of dopants. Zones 92 and 94 are electrically connected to vias 96 and 98 respectively that open up on the back face of the cap.

In a second example, the substrate 74 is a multi-layer comprising at least one resistive layer on its front face. And the doped zones 88 and 90 are formed in this resistive layer, on at least part of the thickness of this resistive layer. For example, a semiconductor on insulator type substrate 74 can then be used, thus comprising a semiconducting surface layer forming the resistive layer mentioned above.

In a third example, the cap 80 is a multi-layer comprising at least one resistive layer on its front face. And the doped zones 92 and 94 are formed in this resistive layer in at least part of its thickness. For example, a semiconductor on insulator type cap 80 is then used, thus comprising a semiconducting surface layer forming the above-mentioned resistive layer.

In a fourth example, the second and third examples are combined: the substrate 74 is as described in the second example and the cap 80 is as described in the third example.

Figure 6:
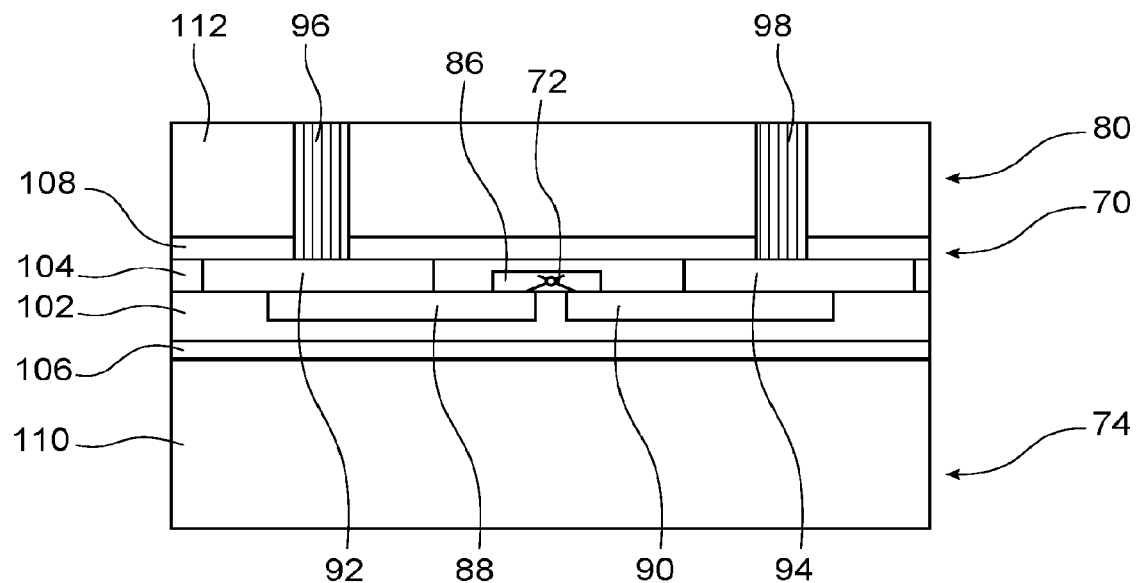
FIG. 6 is a diagrammatic cross-sectional view of a variant of this example.

This fourth example is diagrammatically shown by the cross-sectional view in FIG. 6.

In the case of this FIG. 6, the substrate 74 and the cap 80 are of the SOI type: as can be seen, the substrate 74 comprises a thin silicon layer 102 and a BOX (buried oxide) type of insulation layer 106 and a thick layer of silicon 110, and the cap 80 comprises a thin silicon layer 104 and a BOX (buried oxide) type of insulation layer 108 and a thick layer of silicon 112. Therefore the deposited zones 88, 90 (92, 94 respectively) are located above the insulation layer 106 (108 respectively) as can be seen in FIG. 6.

The structures shown in FIGS. 5A and 6 can be combined to obtain an SOI substrate 74 and a standard cap 80 and vice versa, as has already been explained above.

Figure 7:
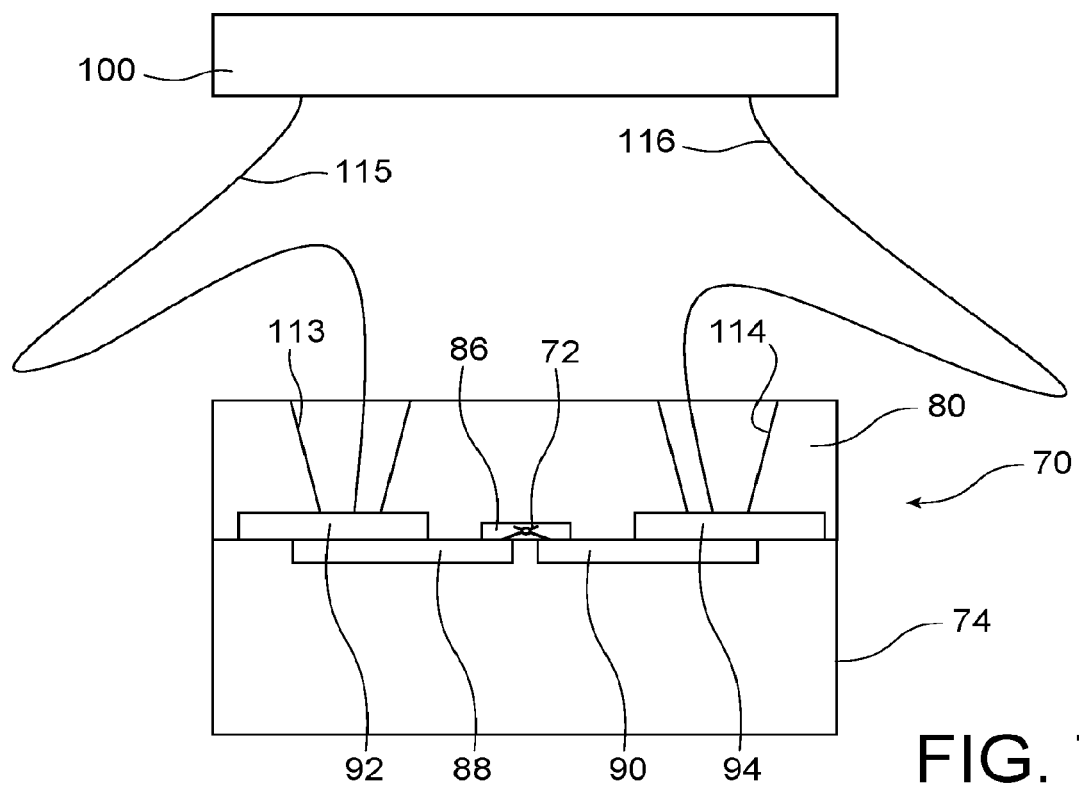
FIG. 7 is a diagrammatic cross-sectional view of another variant of this example.

Another example of the invention is diagrammatically shown by the cross-sectional view in FIG. 7. In this other example, the contact means include:

holes 113 and 114 that taper outwards from the doped zones 92 and 94 to the back face 84 of the cap 80, and electrically conducting wires 115 and 116 that pass through the holes 113 and 114 and are fixed to the doped zones 92 and 94 respectively, as can be seen in FIG. 7.

The wires 115 and 116 may for example be connected to the system 100 mentioned above, to make the measurements.

Therefore in this invention, contact can be made directly on doped zones of the cap through holes 113 and 114. In the example in FIG. 7, contact is made using electrically conducting wires 115 and 116 using the ball bonding technique currently used in microelectronics.

It would be possible to imagine test points (not shown) to make an electrical measurement on the circuit defined by all the interconnects and the nano-object. These test points then replace the wires 115 and 116 and are adapted to be connected to doped zones 92 and 94 through holes 113 and 114 respectively.

Note that the cavity 86 can contain more than one nano-object. It would also be possible to provide more than one cavity, each cavity containing one or several nano-objects. In all cases, there are as many doped zones in the substrate and the cap, and vias (or conducting wires) as necessary to connect the nano-objects used and to make envisaged measurements on them.

The following describes a calculation of the electrical resistance of the chain of conductors 96-92-88 or 98-94-90:

Considering that electrical contacts become narrower as the distance towards the nano-object reduces, as a first approximation the resistance of the line will depend solely on the smallest part of the cross-section (88 or 90).

Element 96 or 98 is denoted C, element 92 or 94 is denoted B and the element 88 or 90 is denoted A. The resistivity of the material forming element i is denoted $\rho_i$, width $I_i$ and length $L_i$ are its dimensions in the plane formed by the front face of the substrate when the cross-section of the conducting element is rectangular (case of A and B), $r_i$ is its radius in the cylindrical case (case of C) and $H_i$ is its height along an axis perpendicular to the plane mentioned above. Therefore the total electrical resistance is equal to R, where $R=R_A+R_B+R_C$, where the resistances correspond to each of the individual elements in the line.

$$R_A = \rho_A \cdot L_A / (I_A \cdot H_A)$$

$$R_B = \rho_B \cdot L_B / (I_B \cdot H_B)$$

$$R_C = \rho_C \cdot L_C / (\pi \cdot r_C^2)$$

Numerical values used for the various elements are given in Table 1:

TABLE 1

| Element | Min length | Max length | Min width | Max width | Min height | Max height |
|---|---|---|---|---|---|---|
| A | 50 μm | 500 μm | 10 nm | 1 μm | 10 nm | 5 μm |
| B | 50 μm | 1 mm | 1 μm | 100 μm | 10 nm | 5 μm |
| | | | Min radius | Max radius | | |
| C | | | 10 μm | 100 μm | 50 μm | 700 μm |

$R/R_A$ can be calculated in all cases in which elements have the same resistivity denoted ρ, and $H_A$ and $H_B$ have the same value denoted H. The numerical application is made from values given in Table 2:

TABLE 2

| IA | LA | IB | LB | H | rC | HC | $R/R_A$ |
|---|---|---|---|---|---|---|---|
| 0.1 | 100 | 10 | 200 | 1 | 10* | 50 | 1.02 |
| 0.1 | 100 | 1 | 1 | 1 | 1 | 1 | 1.00 |

*Since TSVs are composed of concentric tubes, the numerical example considered herein corresponds approximately to a tube with an inside radius of 7 μm and an outside radius of 12 μm.

Therefore it can be seen that the total electrical resistance depends essentially on the resistance of element A, for which the section is smaller than the two others.

However, caution shall be taken to assure that the overlap surfaces between the different doped zones, and particularly the surface of A overlapped by B, are sufficient to not affect the resistance of the line formed by all doped zones. This is achieved by taking a sufficiently large margin, for example a surface areas ratio B/A equal to 5 to 10 times the smallest conducting cross-section, in other words the cross-section of the doped zone. This value will also be corrected as a function of the misalignment tolerated during assembly because this misalignment will modify the overlap area.

Figure 8:
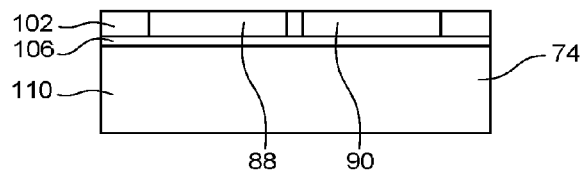
FIG. 8 is a diagrammatic cross-sectional view of a variant of the substrate used in the example in FIG. 6, FIGS. 9A to 9D are diagrammatic top views of various possible patterns for doped zones of the substrate used in the invention.

FIG. 8 diagrammatically shows a variant of the substrate 74 shown in FIG. 6. In this variant, the doped zones 88 and 90 stop on the BOX 106.

FIGS. 9A, 9B, 9C and 9D are diagrammatic top views of the front face of the substrate 74 showing different variants for the geometry of the doped zones associated with the substrate. All these doped zones are marked in these figures with reference 118.

Figure 9A:
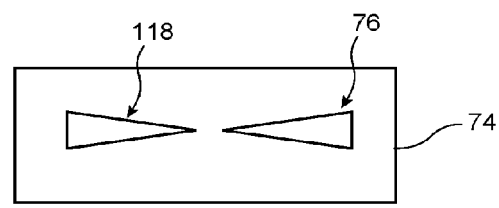
Figure 9B:
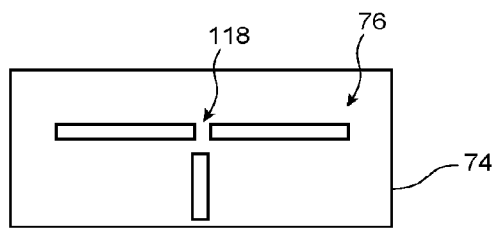
Figure 9C:
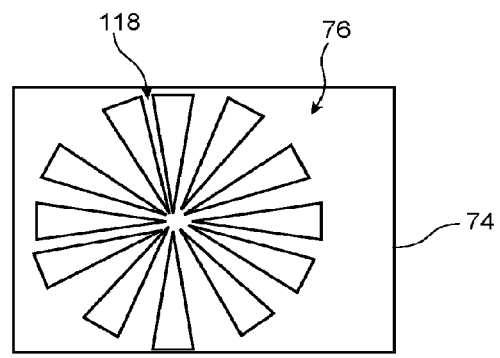
Figure 9D:
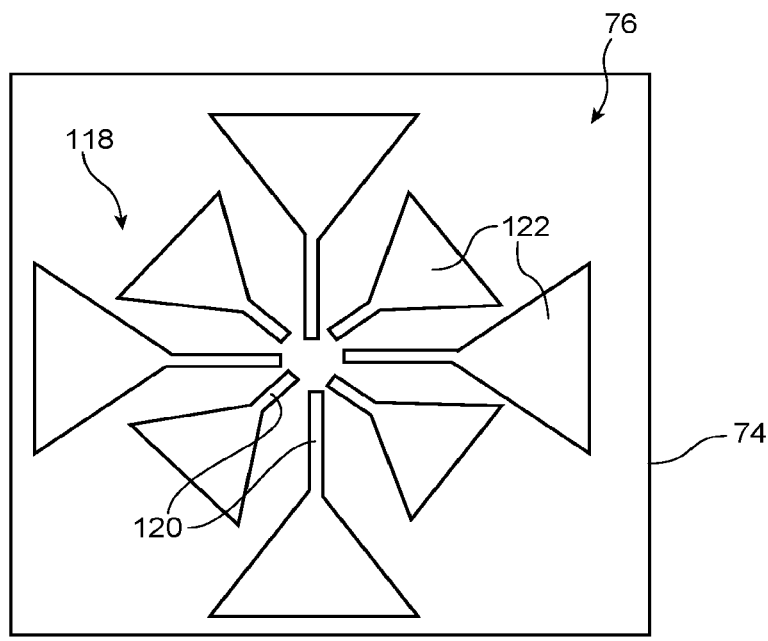

Note that the variant shown in FIG. 9D comprises two sets of doped "lines". Each of these "lines" is composed of a rectangular part 120 and a tapered part 122. The parts 120 are arranged in a star layout so as to have a maximum number of contacts in the central part. Therefore with this distribution, the size of parts 122 can be increased while keeping an identical cross-section pattern for part 120 of all "lines" with a length that varies depending on the patterns, and therefore with an increase in the electrical resistance proportional to the length.

Figure 10:
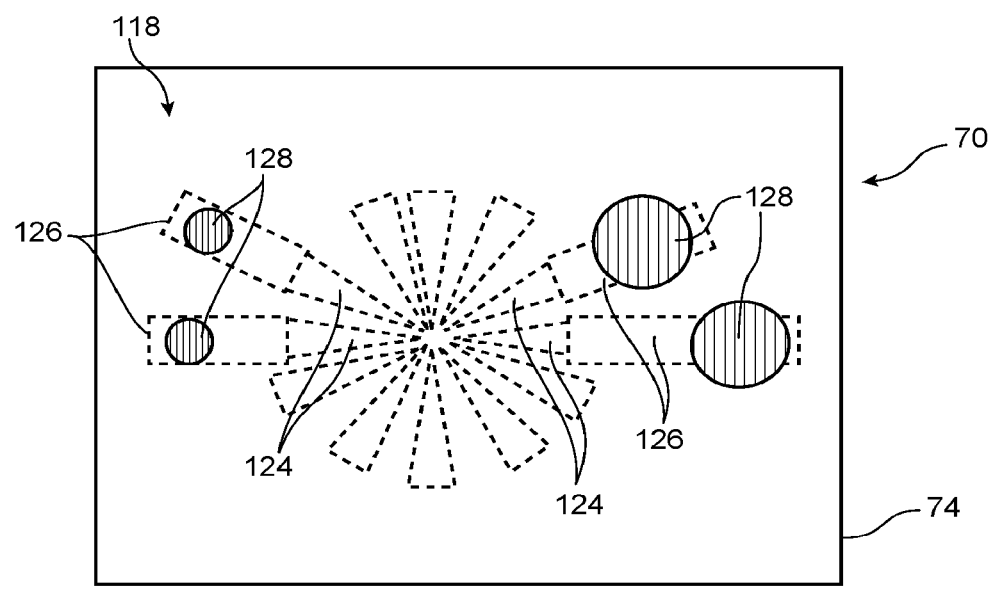
FIGS. 10 and 11 are diagrammatic top views of structures according to the invention comprising doped zones with different geometries or sizes, and FIGS. 12 and 13 diagrammatically show alignment problems that could arise for these doped zones.

FIG. 10 is a diagrammatic top view of a structure 70 for which the doped zones of the substrate 74, in this case denoted 124, have the same geometry. The doped zones of the cap shown on the left part of the FIG. 10, in this case denoted 126, have the same dimensions and the TSVs, in this case denoted 128, have the same diameter. On the right part, the lengths of the doped zones 126 are different, so that a larger diameter can be chosen for TSVs than their diameter on the left part.

Figure 11:
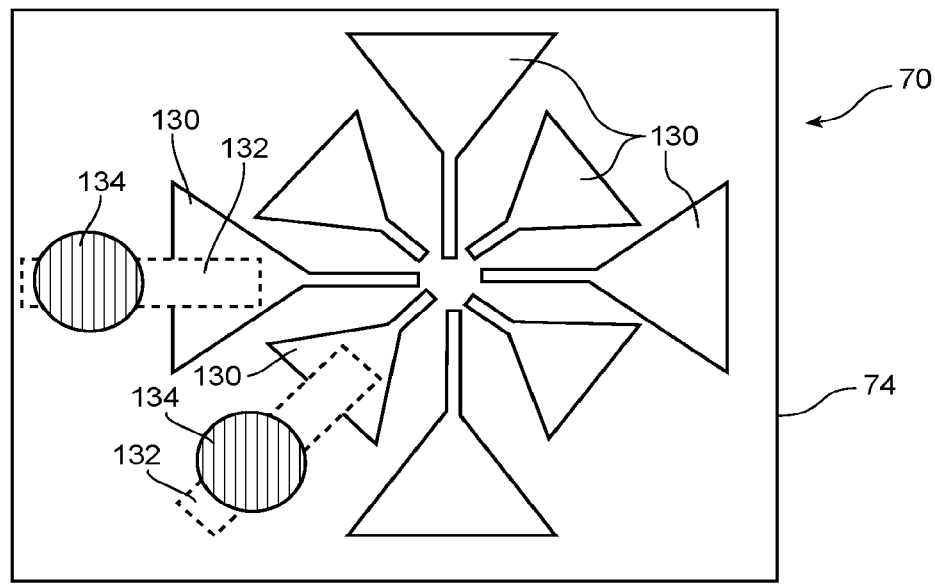

FIG. 11 is a diagrammatic top view of a structure 70 on which the geometries of the doped zones of the substrate 74, in this case denoted 130, are different. The dimensions of the doped zones of the cap, in this case denoted 132, are the same and the same applies for TSVs, in this case denoted 134.

Figure 12:
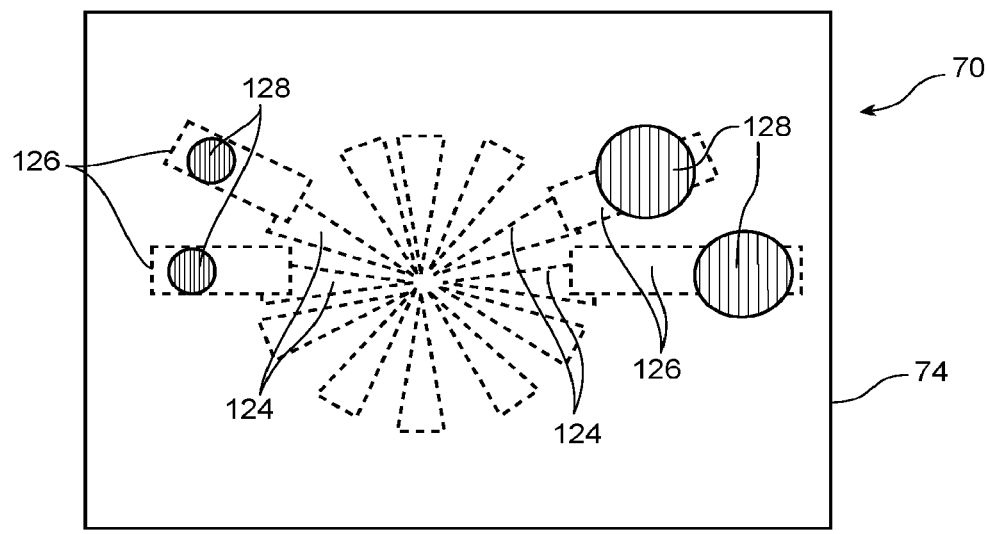

FIG. 12 is a diagrammatic top view of an example structure 70 in which the zones 124 and 126 are not perfectly aligned, in comparison with FIG. 10 (in FIG. 12, the same references have been used as in FIG. 10).

Figure 13:
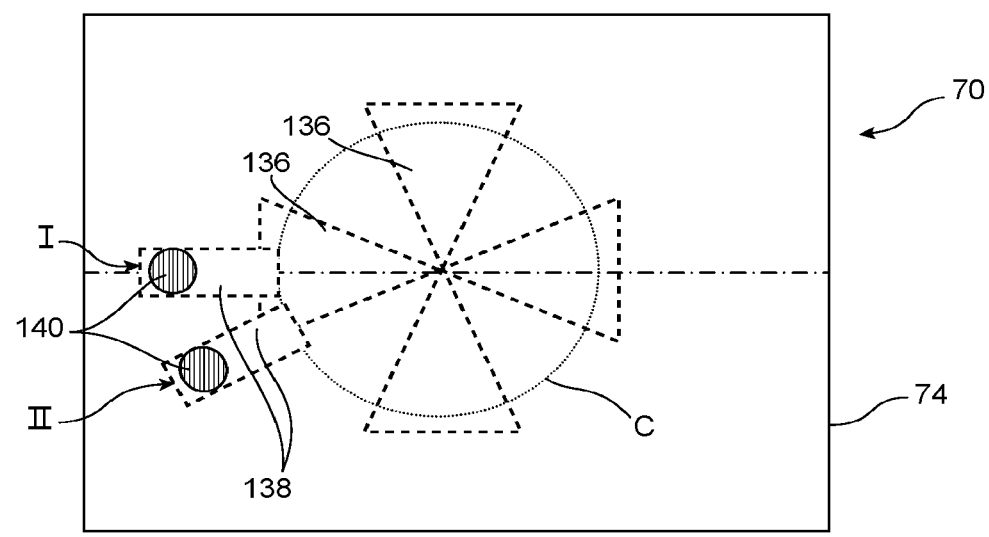

FIG. 13 is a diagrammatic top view of an example structure 70 in which the doped zones 136 corresponding to substrate 74, and the doped zones 138 corresponding to the cap (the corresponding vias are reference 140) are not perfectly aligned (make a comparison between position I and position II).

Let n be the number of sectors that define n/2 zones 136 (n=8 in the case of FIG. 13). The doped zones 138 cover the doped zones 136 starting from the zone delimited by a circle C with radius R. Let L be the width of the zones 138 such that L≤πR/n. Assuming that the minimum overlap zone is equal to L/2, it is easy to calculate the allowable misalignment (between position I and position II) in rotation about an axis perpendicular to the substrate 74 and located at the centre of circle C with radius R. This misalignment is equal to πR/(2n).

Various advantages related to the invention are described below.

1—The structure 70 may be made from silicon alone, silicon oxide and classical silicon type dopants (N or P), typically from two silicon and advantageously SOI wafers (it would be advantageous to use the same SOI for the two wafers). In one variant, it is possible to envisage substrates composed of a first layer of high resistivity monocrystalline silicon under which the BOX is located.

2—For silicon, the two components (substrate and cap) of the structure 70 may be heated to a temperature compatible with atomic reconstruction of their corresponding front faces, typically between 950° C. and 1100° C.

3—Connection lines laid out by doping do not disturb the surface reconstruction necessary for deposition of nano-objects.

4—The pattern of doped zones and control over the diffusion of the dopants must be such that the doped zones can be made with a separation distance of between a few nanometers and several tens of nanometers. Therefore, the ends of the implanted zones have to be moved away by at least twice the diffusion distance to finally obtain electrically conducting zones at a spacing of a few nanometers. These dimensions are compatible with photolithography tools that will be used to define the zones to be implanted.

5—The pattern of the global zone to be implanted may be defined with several geometries and so as to optimise control of the dopant diffusion profile.

6—There is no point in controlling the implantation depth for substrate 74. In the case of an SOI type substrate, the doped zones may go as far as the BOX. Therefore in this case, the steps to implant the substrate and the cap can be done during the same process.

7—TSVs are advantageously made of silicon and are doped before the surface reconstruction treatment that will thus homogenise their doping.

8—Considering the fact that the surface of each of the two wafers is reconstructed and made hydrophobic, the cap 80 can be assembled on the substrate 74 by direct bonding. It is also possible to take advantage of this surface condition to make temporary bonding with a wafer made from the same material as that used to make the wafer to be protected.

The following describes an example of a method of making an encapsulation structure according to the invention.

The materials forming the substrate and the cap are semiconducting materials. The doped zones corresponding to them are obtained by doping of these materials. The two materials have to be doped with the same type of doping, namely the n or p doping, in order to obtain an ohmic type conduction through the interface created when the doped zones corresponding to the cap are assembled on the doped zones corresponding to the substrate. Surfaces are deoxidised in order to avoid generating any interface conduction defects, and therefore the two materials are assembled following a treatment that makes the surfaces hydrophobic.

Refer to the following document:

O. Engström, S. Bengstsson, G. I. Andersson et A. Jauhiainen, J. Electrochem. Soc., Vol. 139, No. 12, December 1992.

This document describes electrical characterisations for an nSi/nSi assembly.

Refer also to the following document:

S. Essig and F. Dimroth, *ECS Journal of Solid State Science and Technology*, 2 (9) Q178-Q181 (2013).

This document describes electrical characterisations for an assembly, for example nSi/nGaAs. Therefore in this case the two semiconducting materials have different natures. This also means that it would be possible for example to make TSVs from doped polysilicon deposited by CVD (chemical vapour phase deposition) in a cap, for example made of Si, with a nature different from the nature of the substrate, for example GaAs. The doping of silicon deposited by CVD may be of the n or p type. The doped polysilicon is deposited by CVD at a temperature close to 600° C.; therefore semiconducting materials capable of resisting such a temperature must be chosen for the cap.

Semiconductors with high resistivity will be chosen in preference (higher than $10^3$ ohm·cm) to avoid isolation of TSVs.

Silicon SOIs will advantageously be chosen in the case of a substrate and/or cap made of SOI.

The characteristics of the used SOIs will preferably be as follows:

thickness of the silicon layer on the front face: from a few tens of nanometers to a few tens of micrometers, and in this case it is made from high resistivity silicon, typically a few $10^3$ ohm·cm, in order to maintain electrical isolation between the different doped zones.

When the substrate is made of SOI, the layer located under the BOX may be made from a material other than silicon (for example a glass, a ceramic or a metal) since this layer has no particular function, other than providing a mechanical support.

BOX thickness: from a few tens of nanometers to a few micrometers.

We will now describe manufacturing of the substrate. The manufacturing steps are:

1s—Deposit the implantation mask on the front face of the substrate (for example this mask may be made of silicon oxide or nitride) and its thickness is of the order of 1 μm or less, depending on the required resolution and the dose to be implanted) and in order to form the corresponding doped zones.

2s—Photolithography and etching of the mask.

3s—implantation of dopants.

4s—Removal of the mask.

5s—Surface preparation of the front face of the substrate: surface smoothing that consists of reducing its roughness advantageously at the atomic scale, is usually done by a high temperature heat treatment. For example the heat treatment for silicon is done at a partial hydrogen pressure at a temperature of between about 950° C. and 1100° C. for a few minutes. It is also possible to use this heat treatment to make the dopants diffuse. The surface thus obtained is hydrophobic in nature.

6s—This surface can then be protected if necessary by a temporary cap prepared using the same method and that will be assembled by direct bonding on the substrate.

7s—The nano-object is formed on the substrate and is connected to the associated doped zones (if the surface has been protected by the transfer of a temporary cap, this cap will be removed before the nano-object placement operation).

8s—The nano-object may possibly be temporarily protected by a method identical to step 6s while waiting for the transfer of the final cap fitted with the electrical connections (note that a cavity will have been made, for example by machining in this temporary cap, according to a step 0c that will be described later, before surface smoothing).

We will now describe fabrication of the cap.

TSVs are made before the cap is assembled to the substrate.

Option I. If TSVs are Made from the Front Face of the Cap.

The manufacturing steps are as follows:

0c—Make the cavity 86 using a conventional photolithography and etching method.

1c—Make TSVs 96, 98 using a photolithography and Deep Reactive Ion Etching (DRIE) process for silicon starting from the front face of the cap. Vias will advantageously be defined for a tube geometry with a thickness equal to a few micrometers (for example 3 μm to 5 μm). Several concentric tubes (for example three concentric tubes) will optionally be made in order to reduce the electrical resistance of the down via, for example starting from a 10 μm inside diameter tube that can then be surrounded by two other tubes with inside diameters equal to 30 μm and 50 μm respectively, for a doped silicon thickness deposited by CVD equal to 5 μm.

It should be noted that for an SOI, it will be necessary to etch the semiconductor and then the BOX and finally the BOX support material that will advantageously be made from a material identical with the material of the first etched layer. Advantageously, silicon will be used. In the configuration in which the doped zone reaches the BOX, TSVs can be made in a non-isolating support, but it will then be necessary to isolate them using the operation described below: TSVs will be isolated by deposition of a semiconducting oxide layer (thickness between 100 nm and about 1 μm), according to an oxidation heat treatment of the semiconductor or a CVD deposition of an oxide.

2c—Fill vertical vias by a chemical vapour deposition (CVD) of doped polycrystalline silicon. In one variant, tungsten deposited by CVD, or more generally any metal compatible with the heat treatment in step 8c and also with the doped semiconductor can be used, because care must be taken to maintain a resistive contact between the two elements.

3c—Chemical mechanical polishing (CMP) to remove the silicon deposited on the front face and if necessary on the back face.

It should be noted that in the case in which TSVs have been isolated, the isolation oxide will have to be etched over a height equivalent to the height of the doped zone, in order to facilitate the passage of current. In this case, created holes are closed off by a new doped polysilicon deposit and a chemical mechanical polishing is repeated.

4c—Deposition of the implantation mask (for example made of silicon oxide or nitride and with a thickness of the order of 1 μm or less, based on the required solution and the dose to be implanted) in order to form the corresponding doped zones.

5c—Photolithography and etching the mask.

6c—Implantation of the dopants. Doping is of the same type as for TSVs, or when they are metallic, such that it enables a resistive conduction between TSVs and doped zones.

7c—Remove the mask.

8c—Surface preparation of the front face of the cap: smoothing of the area that consists of reducing its roughness at the atomic scale is usually done by a high temperature heat treatment. For example, the heat treatment for silicon is done at a partial hydrogen pressure at a temperature of between about 950° C. and 1100° C. for a few minutes. This heat treatment can also be used for making the dopants diffuse. The surface thus obtained is hydrophobic in nature.

9c—Temporary protection of the front face by direct bonding of a handle, advantageously composed of the same material as the cap and treated according to step 8c.

10c—Reduce the cap thickness through its back face (by grinding and then CMP), to expose the TSVs. For the envisaged TSVs, the shape factor (depth divided by the thickness) is of the order of 30, hence typically a silicon thickness of about 100 μm to 150 μm for deposited doped silicon thicknesses from 3 μm to 5 μm).

11c—Remove the temporary protection before assembly with the substrate.

Note that another fabrication sequence could be adopted, in which the order of the steps would be 4c-5c-6c-7c-0c-1c-2c-3c-8c-9c-10c-11c.

The following steps are used to assemble and bond the cap to the substrate:

1a—Align the cap and the substrate. This operation is done using an alignment device conventionally used in the MEMS technology.

2a—Assemble and bond the cap to the substrate by bringing their corresponding front faces into contact, said faces having surface conditions compatible with direct bonding (for example these faces have atomic roughness). Advantageously, the assembly operation will be made under a controlled atmosphere.

Option II. If the TSVs are Made from the Back Face of the Cap.

The fabrication steps are as follows:

Operations 0c and 4c to 9c according to option I for preparation of the cap are used. After assembly with a temporary handle 9c, the handle will be used as mechanical support for the cap that will then be machined on its back face in accordance with steps 1c, 10c and 11c for manufacturing the cap. The next step is to perform the filling (2c) and polishing (3c) steps before making another surface smoothing (step 8c).

The following describes how the method can be modified in the case in FIG. 7 in which TSVs are replaced by wires passing through the holes. Firstly steps 4c to 6c are carried out. These holes are then advantageously made using a photolithography method and by anisotropic etching of the cap from its back face. This is done using a TMAH (Trimethyl Ammonium Hydroxide) bath to etch silicon. This is a method known to those skilled in the art. It is advantageous because it can be used to make deep cavities a few hundred microns deep in the silicon. Etching will be stopped by the oxide layer in the case of an SOI. The next step is etching of the SOI layer using a dry or wet method in order to expose implanted zones. Finally, the next step after the implanting and etching stencils have been removed is a step to smooth the surface (step 8c) before the cap is assembled to the substrate (steps 1a and 2a).

A first metal is deposited in the bottom of the holes in order to benefit from a resistive contact between the doped zone and an electric conductor such as a wire or an electric test point. A metal compatible with the dopant type will be chosen so as to give an ohmic type conduction. Visible doped zones at the bottom of the holes are advantageously pickled before this deposit is made, so as to eliminate any native oxide that could increase the contact resistance between the conductor and the doped zone. The next step will be to deposit a second metal advantageously based on gold, copper or aluminium if it is required to make connections using gold or copper wires on these zones using the ball bonding type technique.

It will be seen that according to deposition methods in holes (for example through a stencil so that no lithography is necessary), it may also be possible to transfer electrical contacts to the back face of the cap provided that an electrical insulator has firstly been deposited on the flanks of the holes.

The invention claimed is:

1. Structure for encapsulation of at least one nano-object comprising:
   a substrate with opposite first and second faces,
   a cap with opposite first and second faces, the first face of the cap being fixed to the first face of the substrate,
   at least one cavity defined between the cap and the substrate,
   at least one nano-object in the cavity, and
   first doped zones that are in the substrate on the first face of the substrate, the nano-object being electrically connected to at least two of said first doped zones,
   second doped zones that are in the cap on the first face of the cap and that are electrically connected to the first doped zones, and
   means of making contact that range from the second face to the first face of the cap and that open up on the second doped zones, these means being electrically connected to these said second zones.

2. Encapsulation structure according to claim 1, in which the second doped zones are at least partially in direct contact with the first doped zones.

3. Encapsulation structure according to claim 1, in which the substrate is a first multi-layer and comprises at least a first resistive layer on the first face of the substrate, and in which the first doped zones are formed in the first resistive layer, on at least part of the thickness of the first resistive layer.

4. Encapsulation structure according to claim 3, in which the substrate is of the semiconductor on insulator type and it thus comprises a first semiconducting surface layer, and in which the first resistive layer is formed by the first semiconducting surface layer.

5. Encapsulation structure according to claim 1, in which the cap is a second multi-layer and it comprises at least one second resistive layer on the first face of the cap, and in which the second doped zones are formed in the second resistive layer, on at least part of the thickness of the second resistive layer.

6. Encapsulation structure according to claim 5, in which the cap is of the semiconductor on insulator type and it thus comprises a second semiconducting surface layer, and in which the second resistive layer is formed by the second semiconducting surface layer.

7. Encapsulation structure according to claim 1, in which the means of making contact include vias passing through the cap.

8. Encapsulation structure according to claim 1, in which the contact means include:
   holes that taper outwards from the second doped zones to the second face of the cap, and
   electrically conducting wires respectively arranged in said holes and that are electrically connected to the corresponding second doped zones respectively.

9. Encapsulation structure according to claim 1, in which the contact means include:
   holes that taper outwards from the second doped zones to the second face of the cap, and
   electrically conducting test points, respectively arranged in said holes and adapted to be electrically connected to the corresponding second doped zones respectively.

10. Encapsulation structure according to claim 1, in which the first face of the cap is fixed to the first face of the substrate by bonding.

11. Encapsulation structure according to claim 10, in which bonding is direct.

12. Method of fabricating the encapsulation structure according to claim 1, in which:
    the first doped zones are formed in the substrate,
    the cavity is formed in the cap,
    the means of making contact are formed in the cap,
    the second doped zones are formed in the cap,
    said at least one nano-object is connected to said at least two first doped zones, and
    the cap is assembled and bonded to the substrate.

13. Method of fabricating the encapsulation structure according to claim 12 in which a smoothing step of said first face of the substrate and/or said first face of the cap is/are carried out after the step to make the first doped zones and/or the second doped zones respectively.

14. Method of fabricating the encapsulation structure according to claim 12, in which bonding is a direct bonding.

* * * * *